United States Patent

Sharples et al.

[15] 3,676,688

[45] July 11, 1972

[54] PHOTOSENSITIVE DEVICES INCORPORATING POLYMERIC ELEMENTS WHICH GIVE HIGH ABSOLUTE PHOTO-CURRENTS

[72] Inventors: Allan Sharples; Arthur John Rostron; Graeme McGibbon, all of Edinburgh, Scotland

[73] Assignee: Ilford Limited, Ilford, Essex, England

[22] Filed: Aug. 26, 1969

[21] Appl. No.: 853,208

[30] Foreign Application Priority Data

Aug. 29, 1968 Great Britain ....................41,380/68
Feb. 26, 1969 Great Britain ....................10,226/69

[52] U.S. Cl. ....................................250/211 R, 252/501
[51] Int. Cl. ....................................H01j 39/12
[58] Field of Search ..............250/211; 252/501; 96/1, 1.5; 136/89

[56] References Cited

UNITED STATES PATENTS 3,127,266 3/1964 Süs ....................................252/501
3,331,687 7/1967 Kosche ....................................252/501

*Primary Examiner*—James W. Lawrence
*Assistant Examiner*—D. C. Nelms
*Attorney*—Cushman, Darby & Cushman

[57] ABSTRACT

This application describes a photosensitive device which comprises a thin sheet of a polymeric compound having an electrode directly on each face, the relationship of the work functions of the polymer and of the material of at least one of the electrodes being such that there is charge transfer across the interface when the device is illuminated. The polymeric compound is one in which there is a high degree of electronic orbital overlap between hydrogen atoms in adjacent polymer chains, or is a polymeric vinyl compound which carries groups on carbon atoms of the polymer chain which have a high electronegativity. Typically useful polymers are polyvinyl fluoride, polyvinyl acetate, polyvinyl alcohol, nylons, polyurethanes and polyacrylamides and copolymers of vinylidene fluoride and hexafluoropropene. On application of 100 V between the electrodes in the dark and under conditions of illumination of 1000 lux, a difference in dark and photocurrents of at least a factor of 10 may be obtained.

6 Claims, No Drawings

PHOTOSENSITIVE DEVICES INCORPORATING POLYMERIC ELEMENTS WHICH GIVE HIGH ABSOLUTE PHOTO-CURRENTS

The present invention relates to photosensitive devices i.e., devices containing materials of which the conductivity is altered by the incidence of photon radiation.

Particularly the present invention makes use of polymeric materials. It is known that substantial photoelectric effects may be obtained from certain polymeric materials such as the polyvinyl carbazole/picric acid complex (see British Pat. No. 856770 and H. Hoegl, J. Phys. Chem., 69 755, (1965).), but these polymeric materials do not give high absolute photocurrents, and the maximum absolute photocurrent obtainable from such materials is usually only about $10^{-8}$ A.

It is an object of the present invention to provide photosensitive devices incorporating polymeric elements and which give high absolute photocurrents.

According to the present invention there is provided a photosensitive device which comprises a thin sheet of a polymeric compound having an electrode directly on each face, the relationship of the work functions of the polymer and of the material of at least one of the electrodes being such that there is charge transfer across the interface when the device is illuminated.

More particularly, the invention provides a photosensitive device in which a thin layer of polymer compound is located between two electrodes and wherein the type of polymeric compound, electrode material and thickness of layer are such that a measurable difference between dark and photocurrents is obtained on application of an external voltage. Preferably, the materials and their relationship are such that on application of 100V between the electrodes in the dark and under conditions of illumination of 1,000 lux, a difference in dark and photocurrents of at least a factor of 10 is obtained.

It is an important characteristic of the devices according to the present invention that such devices not only pass photocurrent when illuminated by radiation of shorter wavelength than the wavelength of the absorption edge of the electrode material but also when illuminated by radiation of longer wavelengths.

The polymer may be, for example, a polymeric vinyl compound which carries groups on carbon atoms of the polymer chain which have a high electronegativity. In such compounds there is a high degree of electronic orbital overlap with hydrogen atoms in adjacent polymer chains, e.g.,

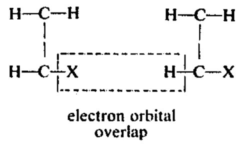

In this way there is established an electronic band structure involving the three atom sequence H—C—X. The required high electron affinity in the polymer is thus achieved.

Hitherto, polymeric materials which have been suggested for electrical and photoelectric effects have contained $\pi$ orbitals. It is to be observed that the polymers used in the present invention do not necessarily contain $\pi$ orbitals.

One possible measure of the ability of a polymer to establish such electronic bands and also to possess a high work function, is its dielectric constant, although in view of the variety of molecular factors which contribute to this property, it is not an unequivocal guide. In general, however, if the dielectric constant of the polymer exceeds 7 it may be considered suitable, and increasing effects occur as this value is progressively exceeded.

The polymeric material should preferably be such that at least 20 percent of the carbon atoms carry electronegative substituents. The substituents may take the form of single atoms, fluorine being a good example, or of groups of atoms, of which the following are to be preferred:

—OH and $CH_3COO$

Thus suitable polymers include polyvinyl fluoride, polyvinyl acetate, polyvinyl alcohol.

The polymer need not, however be a carbon-carbon chain polymer. Any other type of polymer in which a lateral sequence of covalently-bonded atoms are in strong electron orbital overlap with a similar sequence on an adjacent chain may be used.

Thus, it is possible to use various polyamides, for example various types of nylon such as nylon 6 (polycaproamide) and nylon 66 (polyhexamethylene adipamide). Polyurethanes may also be employed, as may polyacrylamides.

It is also possible to use copolymers which fulfil the conditions set out above. Of particular value are copolymers of vinylidene fluoride and hexafluoropropene such as those sold under the Trade Mark VITON. Polymers which afford flexible films are preferred.

The electrodes used to make electrical connection to the photoconductive element are preferably metallic, and are preferably vacuum deposited onto the polymeric material to give an intimate contact between electrode and polymeric material.

Preferred are metals of low work function, e.g., aluminum, sodium, though since such materials need to be protected from atmospheric oxidation, it is often desirable to use metals of higher work function but high resistance to oxidation; silver and gold are suitable.

It is also possible, in photosensitive devices according to the present invention, to make the electrodes of semiconducting material, for example silicon or germanium. Such electrodes are, of course, themselves photosensitive, but by combination of their own photosensitivity with that of the polymeric materials noted, useful photosensitive devices can be produced.

While applicants would not wish to be bound by any theory as to why the large photocurrents obtainable in devices according to the present invention are generated, it is believed that the following may be the mechanism involved : charge from the metallic electrode is injected into the polymeric material and, in dark conditions, trapped there. On irradiation of the polymeric material with light, the charge is released either from these traps or from the electrode, and accordingly a photo-current is observed.

An important advantage of photosensitive devices according to the present invention is that the polymers themselves absorb very little light. It is accordingly possible to construct devices having deposited on a polymeric film very thin metallic electrodes, the total device having a high transparency. Using deposited silver electrodes, a transparency of 65 percent at a wavelength of 450 nm can be obtained. Such a device may be used, for example, to monitor the intensity of a beam of light.

It is possible to produce very highly transparent devices of this type if the electrodes used are not of metal but of a conductive transparent polymeric material, for example polyethylene oxide.

A further advantage of photosensitive devices according to the invention is that photocurrent may be obtained using light of relatively low energy, i.e., in the red end of the visible spectrum.

The present invention further provides a process for the production of electrical signals modulated in accordance with modulated optical information comprising the step of the signal-wise exposure to active electromagnetic radiation of a photosensitive device as defined above, at least one of the electrodes being transparent or semi-transparent to the applied radiation, a sufficient potential difference being applied between the electrodes during such exposure to provide a current through the polymeric compound which is modulated according to said exposure.

The following examples will serve to illustrate the invention:

EXAMPLE 1

A 29 $\mu$m (i.e. $2.9 \times 10^{-3}$ cm) thick film of polyvinyl fluoride (du Pont type) was coated on one side with thin, semi-transparent silver, by evaporation in vacuo. The other side was then coated with a much thicker silver film. On applying a voltage of 120 V., with the negative side connected to the semi-transparent silver, a dark current of $2 \times 10^{-9}$ A was obtained. On irradiating 3.1 $cm^2$ of this electrode with a light from a 125 W MB/U mercury lamp placed 13 cm from the film (with the glass envelope removed to permit maximum utilization of the available ultraviolet radiation), a current of $5 \times 10^{-8}$ A was obtained, with the system in a vacuum of $10^{-4}$ torr. By increasing the current through the lamp from 0.9 A to 2.0 A (thereby increasing the intensity) and by increasing the voltage across the film to 950 V, a photo-current of $1.2 \times 10^{-5}$ A was obtained.

EXAMPLE 2

Conditions similar to Example 1 were used, but the u.v. lamp (mercury MB/U) was replaced by a 110 W tungsten/iodine lamp, in conjunction with an OYl orange-yellow filter. The U.V. component of this light was negligible, but the photo-current was $10^{-7}$ A using 120 V, i.e., slightly in excess of that obtained using the mercury U.V. lamp at the lower intensity and voltage.

In Examples 1 and 2, the photocurrent is very much higher than has ever previously been obtained through simple polymer systems. The light/dark current ratio, however, although large enough to permit the construction of photosensitive devices can be increased by suitable choice of a polymer/electrode combination, which gives high light/dark current ratios, even for high absolute values of the photocurrent. Examples 3–5 illustrate this.

EXAMPLE 3

A 10 $\mu$m thick samples of polyvinyl acetate was cast from chloroform and coated with a semi-transparent silver film on one face, and a thick silver film on the other. On irradiation with an MB/U mercury lamp at a distance of 13 cm and for an area 3.1 $cm^2$, a photo-current of $1.5 \times 10^{-7}$ A was obtained with 850 V on the front electrode. The light/dark current ratio, however, was 10,000. All these results were obtained in a vacuum of $10^{-4}$ torr. Visible light effects could also be obtained with this polymer, using a 100 W tungsten/iodine/OYl source, and a photocurrent of $3 \times 10^{-8}$ A was obtained using 500 V. The importance of the electrode/polymer contact was demonstrated in this case by the fact that the long wave length photocurrent was reduced to an insignificant value when the evaporated semi-transparent silver electrode was replaced by a pressed contact, using semi-transparent silver on quartz.

EXAMPLE 4

A carefully dried polyvinylalcohol (Elvanol) film, cast from water and of 30 $\mu$m thickness, and having the same silver electrode configuration as in Examples 1–3, showed high photoeffects, particularly when irradiated in vacuo with light of longer wavelength. With −120 V on the front electrode, a dark current of $6.4 \times 10^9$ A was recorded and, on irradiation with light from a tungsten/iodide OYl filtered light source, a photocurrent of $4.3 \times 10^{-5}$ A was obtained. On irradiation with a 500 W Philips Photoflood lamp, the current through the polymer sample reached $5.05 \times 10^{-4}$ A, and on increasing the applied voltage from 120 V to 360 V, current levels as high as 2 mA were obtained. With ultraviolet (MB/U) light irradiation, photocurrents were typically 10 × the dark current, at 120 V. The rapid time constant of this effect (approx. 1 second) indicates that the increased current on irradiation is due primarily to light rather than heat.

Using polyvinyl alcohol samples which were less carefully dried than above, dark currents, at 120 V, were high ($10^{-6}$ A), and both long and short wavelength photocurrents were of the order of $10^{-5}$ A.

EXAMPLES 5–12

In these examples, the results of which are tabulated below, films of the polymeric material in question were coated on one side with a thick layer of silver or aluminum and on the light facing side with a semi-transparent layer of silver. The samples were irradiated in vacuo ($10^{-4}$ torr) from a distance of 14 cm.

It is to be noted from the table which follows that some polymers which show high dark currents, such as VITON, show little photoeffects at high applied voltages but a large photoeffect at low voltages. This arises since the dark current is more voltage dependant than the photocurrent, and the two currents merge at high voltages.

TABLE

| Ex. No. | Material used | Thickness | Applied Voltage | $i_d$ | $i_{U.V.}$ |
|---|---|---|---|---|---|
| 5 | Nylon 6 | 32–90 $\mu$m | 125 V | 800 nA | 4000 nA |
| | (polycaproamide) | 32–90 $\mu$m | 9.4 | 0.8 | 24 |
| 6 | Nylon 66 | 55–80 | 125 | 0.3 | 44 |
| | (polyhexamethylene adipamide) | 55–80 | 9.4 | 0.003 | 13 |
| 7 | Nylon 6.10 | 60–80 | 125 | 0.3 | 43 |
| 8 | Nylon 11 | 30–32 | 125 | 2 | 1000 |
| 9 | Nylon 11/nylon 6 copolymer | 35 | 125 | 0.3 | 37 |
| 10 | Viton, copolymer of (Vinylidene fluoride | 60–80 | 125 | 10 | 16 |
| | and hexafluoropropene) | 60–80 | 9.4 | 0.3 | 5.8 |
| 11 | Polyacrylic acid | 18–25 | 125 | 10 | 55 |
| 12 | Polyacrylamide | 25–30 | 125 | 1.3 | 13 |

Notes:
$i_d$ = Dark current
$i_{U.V.}$ = photo-current with 125 W MB/U mercury lamp/water filter.

We claim as our invention:

1. A photosensitive device which comprises a thin sheet of a polymeric compound having an electrode permanently directly on each face, the relationship of the work functions of the polymer and of the material of at least one of the electrodes being such that there is charge transfer across the interface when the device is illuminated, the said polymeric compound being selected from the class consisting of polyvinyl fluoride, polyvinyl alcohol, polyvinyl acetate, polyamides, polyurethanes, polyacrylamides and a copolymer of vinylidene fluoride and hexafluoropropene.

2. A photosensitive device according to claim 1 wherein the polymeric compound, electrode material and thickness of layer are selected so that a measurable difference between dark and photo-currents is obtained on application of an external voltage.

3. A photosensitive device according to claim 2 wherein the polymeric compound, electrode material and thickness of layer are such that on application of 100 V between the electrodes in the dark and under conditions of illumination of 1,000 lux, a difference in dark and photocurrents of at least a factor of 10 is obtained.

4. A photosensitive device according to claim 1 which will pass photocurrent when illuminated by radiation of wavelength longer than the wavelength of the absorption edge of the electrode material and of the polymer, said polymer being selected from the group consisting of polyvinyl fluoride, polyvinyl acetate, polyvinyl alcohol, nylons, polyurethanes and polyacrylamides and the electrode material comprising polyethylene oxide.

5. A photosensitive device according to claim 1 wherein the polymeric compound, electrode material and layer thickness are such that on illumination, said device will pass a photocurrent of at least $10^{-7}$ A.

6. A photosensitive device according to claim 1 wherein the polymer is a copolymer of vinylidene fluoride and hexafluoropropene.

* * * * *